(12) United States Patent
Fukumoto et al.

(10) Patent No.: US 9,208,710 B2
(45) Date of Patent: Dec. 8, 2015

(54) SEMICONDUCTOR DEVICE

(75) Inventors: Ryota Fukumoto, Kanagawa (JP);
Mitsuaki Osame, Kanagawa (JP);
Hiroyuki Miyake, Kanagawa (JP);
Yoshifumi Tanada, Kanagawa (JP);
Seiko Amano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 190 days.

(21) Appl. No.: 13/017,065

(22) Filed: Jan. 31, 2011

(65) Prior Publication Data

US 2011/0122121 A1 May 26, 2011

Related U.S. Application Data

(62) Division of application No. 11/548,024, filed on Oct. 10, 2006, now abandoned.

(30) Foreign Application Priority Data

Oct. 21, 2005 (JP) ................................. 2005-307856

(51) Int. Cl.
*G09G 3/20* (2006.01)
*G02F 1/1345* (2006.01)
*G09G 3/32* (2006.01)
*H01L 27/12* (2006.01)

(52) U.S. Cl.
CPC ............. *G09G 3/20* (2013.01); *G02F 1/1345* (2013.01); *G09G 3/3225* (2013.01); *G09G 2300/0426* (2013.01); *G09G 2310/0275* (2013.01); *G09G 2330/02* (2013.01); *H01L 27/12* (2013.01)

(58) Field of Classification Search
None
See application file for complete search history.

(56) References Cited

U.S. PATENT DOCUMENTS

| | | | | |
|---|---|---|---|---|
| 4,155,090 A | * | 5/1979 | Kuroyanagi et al. | 343/713 |
| 4,623,803 A | | 11/1986 | Thompson et al. | |
| 5,059,822 A | | 10/1991 | Dukes | |
| 5,274,280 A | | 12/1993 | Ito et al. | |
| 5,300,798 A | * | 4/1994 | Yamazaki et al. | 257/207 |
| 5,345,098 A | * | 9/1994 | Hirabayashi et al. | 257/207 |

(Continued)

FOREIGN PATENT DOCUMENTS

| | | |
|---|---|---|
| EP | 0 950 917 A1 | 10/1999 |
| EP | 1 193 674 A2 | 4/2002 |

(Continued)

OTHER PUBLICATIONS

Search Report (European Patent Application No. 06 021 360.0) mailed Jan. 8, 2009, 7 pages.

*Primary Examiner* — Antonio Xavier
(74) *Attorney, Agent, or Firm* — Fish & Richardson P.C.

(57) ABSTRACT

The present invention provides a semiconductor device in which a power line is not affected by noise due to a voltage drop caused by instantaneous high-current consumption in the buffer portion and that has no possibility that a logic portion malfunctions. In a case where the same potential is supplied to a logic portion and a buffer portion, by a method in which separate FPC terminals are used for the logic portion and the buffer portion, or by a method in which the FPC terminal is shared but a power line is branched for the logic portion and the buffer portion at a point close to the FPC terminal, a problem that the logic portion is affected by noise generated by a voltage drop of the power line due to instantaneous high-current consumption in the buffer portion can be prevented.

18 Claims, 11 Drawing Sheets

(56) References Cited

U.S. PATENT DOCUMENTS

| | | | |
|---|---|---|---|
| 5,473,182 A * | 12/1995 | Kumagai | 257/355 |
| 5,670,802 A | 9/1997 | Koike | |
| 5,701,597 A * | 12/1997 | Nakanishi et al. | 455/127.1 |
| 5,814,851 A | 9/1998 | Suh | |
| 5,872,737 A | 2/1999 | Tsuruda et al. | |
| 5,923,089 A | 7/1999 | Yao et al. | |
| 6,021,081 A | 2/2000 | Higashide et al. | |
| 6,064,557 A * | 5/2000 | Yamasaki et al. | 361/111 |
| 6,130,447 A * | 10/2000 | Han | 257/207 |
| 6,262,702 B1 | 7/2001 | Murade | |
| 6,339,711 B1 * | 1/2002 | Otaka et al. | 455/550.1 |
| 6,433,441 B1 * | 8/2002 | Niwa et al. | 257/784 |
| 6,483,493 B2 | 11/2002 | Murade | |
| 6,489,671 B2 * | 12/2002 | Aoki et al. | 257/691 |
| 6,514,101 B1 * | 2/2003 | Miura | 439/495 |
| 6,774,876 B2 | 8/2004 | Inukai | |
| 7,054,357 B1 * | 5/2006 | Inomata et al. | 375/225 |
| 7,102,718 B1 * | 9/2006 | Yamazaki et al. | 349/141 |
| 7,710,379 B2 | 5/2010 | Iwabuchi et al. | |
| 2001/0015709 A1 * | 8/2001 | Imajo et al. | 345/87 |
| 2002/0025610 A1 * | 2/2002 | Litwin et al. | 438/129 |
| 2002/0030656 A1 * | 3/2002 | Goto et al. | 345/89 |
| 2002/0105263 A1 * | 8/2002 | Kim | 313/498 |
| 2003/0022533 A1 * | 1/2003 | Joo | 439/67 |
| 2003/0095049 A1 * | 5/2003 | Suzuki et al. | 340/870.13 |
| 2003/0096530 A1 * | 5/2003 | Ma et al. | 439/495 |
| 2003/0146712 A1 * | 8/2003 | Inukai | 315/169.3 |
| 2003/0169250 A1 * | 9/2003 | Kimura | 345/212 |
| 2003/0174114 A1 * | 9/2003 | Yamazaki | 345/97 |
| 2003/0193493 A1 * | 10/2003 | Ozawa | 345/204 |
| 2003/0207503 A1 * | 11/2003 | Yamazaki et al. | 438/149 |
| 2003/0218246 A1 * | 11/2003 | Abe et al. | 257/734 |
| 2003/0227997 A1 * | 12/2003 | Petrick et al. | 378/98.8 |
| 2004/0021426 A1 | 2/2004 | Osame et al. | |
| 2004/0026782 A1 * | 2/2004 | Anzai | 257/737 |
| 2004/0129981 A1 * | 7/2004 | Kim et al. | 257/368 |
| 2004/0147066 A1 * | 7/2004 | Yamazaki et al. | 438/151 |
| 2004/0246384 A1 * | 12/2004 | Kita | 348/790 |
| 2004/0263066 A1 | 12/2004 | Abe et al. | |
| 2005/0030465 A1 * | 2/2005 | Park et al. | 349/149 |
| 2005/0051898 A1 * | 3/2005 | Minami et al. | 257/750 |
| 2005/0105034 A1 * | 5/2005 | Ono et al. | 349/143 |
| 2005/0117410 A1 * | 6/2005 | Shin | 365/189.09 |
| 2005/0225544 A1 * | 10/2005 | Ishibashi | 345/204 |
| 2005/0230757 A1 * | 10/2005 | Nagasawa et al. | 257/355 |
| 2005/0248713 A1 * | 11/2005 | Hirosue et al. | 349/158 |
| 2006/0046201 A1 * | 3/2006 | Sandhu et al. | 430/314 |
| 2006/0066529 A1 * | 3/2006 | Kanda | 345/76 |
| 2006/0151210 A1 * | 7/2006 | Hirai | 174/495 |
| 2006/0244741 A1 | 11/2006 | Kimura et al. | |
| 2006/0250083 A1 * | 11/2006 | Oh et al. | 313/512 |
| 2006/0279371 A1 * | 12/2006 | Sato et al. | 333/1 |
| 2008/0272992 A1 * | 11/2008 | Kwak | 345/76 |
| 2009/0040414 A1 * | 2/2009 | Kawachi | 349/48 |
| 2009/0179549 A1 | 7/2009 | Abe et al. | |

FOREIGN PATENT DOCUMENTS

| | | |
|---|---|---|
| EP | 1 345 070 A2 | 9/2003 |
| EP | 2 189 839 A1 | 5/2010 |
| JP | 01-243578 A | 9/1989 |
| JP | 11-223832 A | 8/1999 |
| JP | 2000-122027 A | 4/2000 |
| JP | 2000-206493 A | 7/2000 |
| JP | 2002-202755 A | 7/2002 |
| JP | 2004-327431 A | 11/2004 |
| JP | 2005-099770 A | 4/2005 |
| JP | 2005-227336 A | 8/2005 |

* cited by examiner

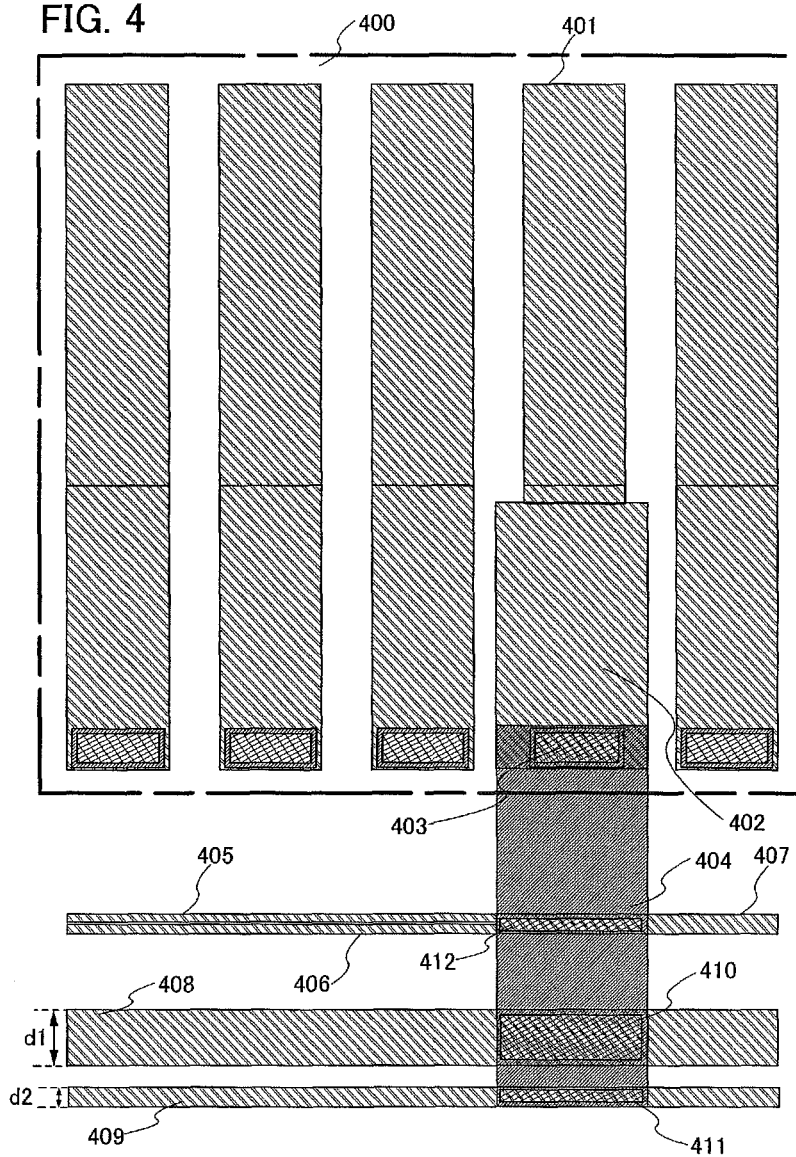

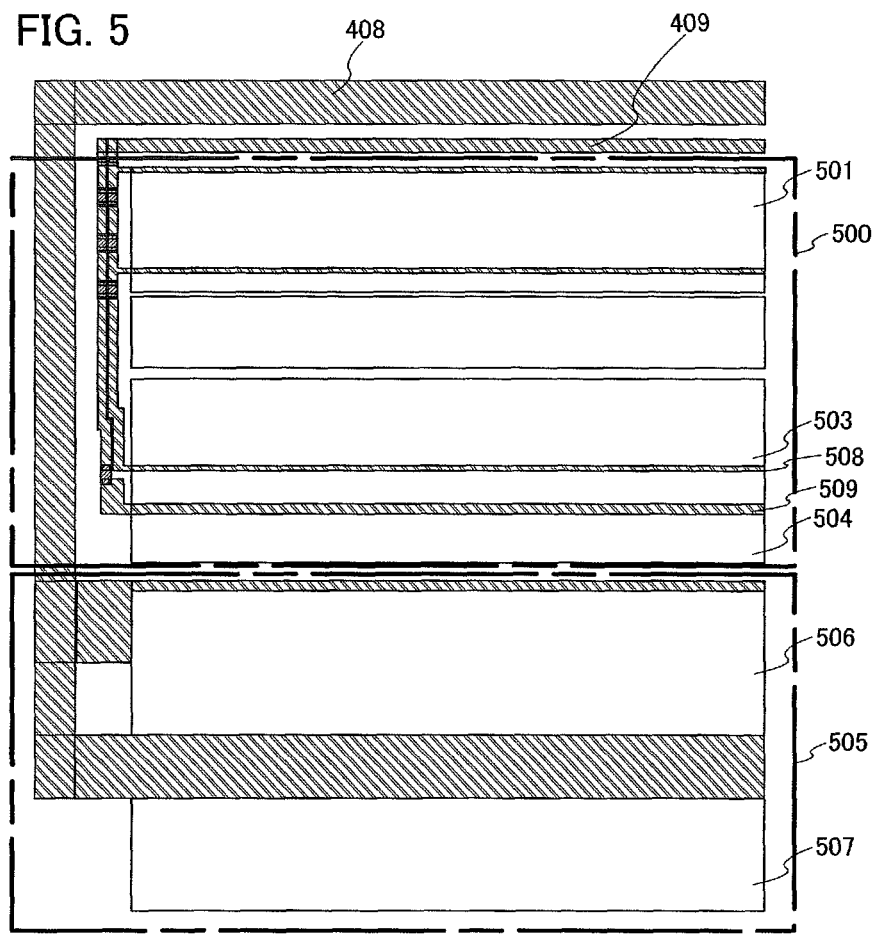

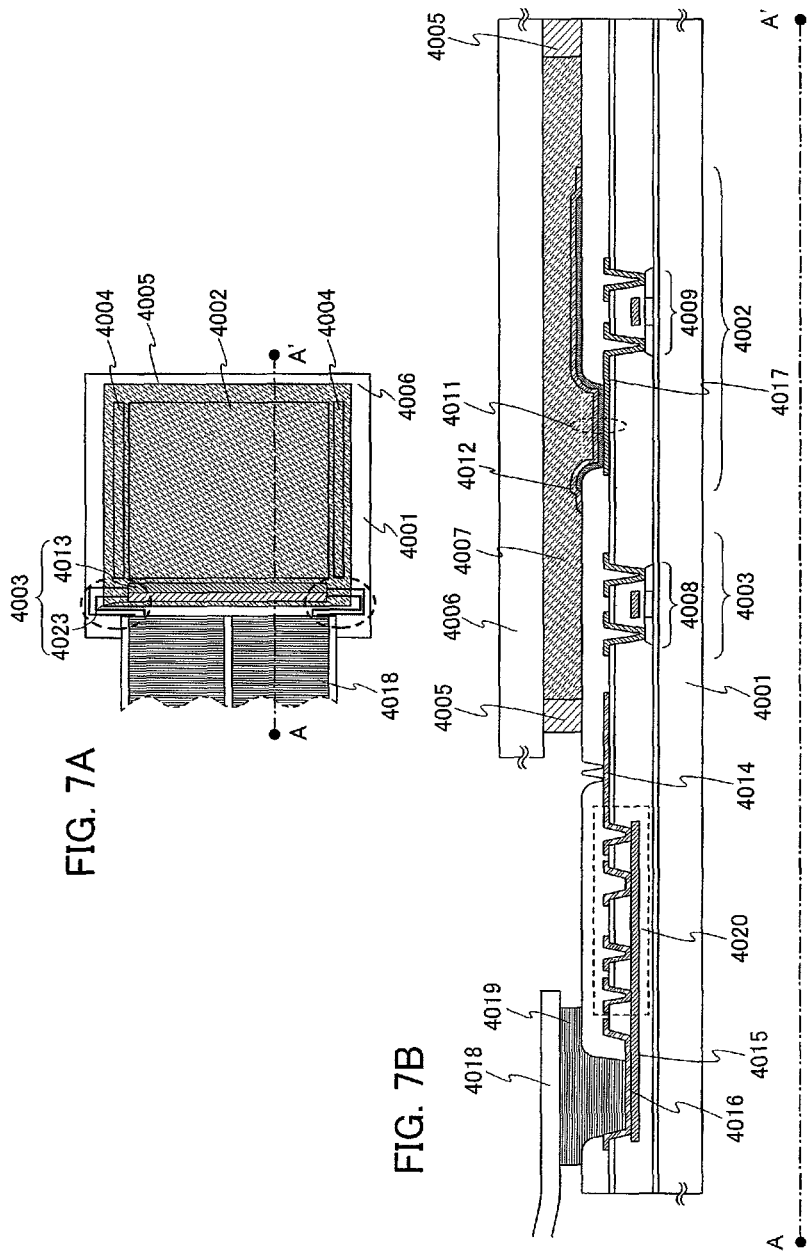

SEMICONDUCTOR DEVICE

CROSS-REFERENCE TO RELATED APPLICATIONS

This application is a divisional of U.S. application Ser. No. 11/548,024, filed Oct. 10, 2006, now pending, which claims the benefit of a foreign priority application filed in Japan as Serial No. 2005-307856 on Oct. 21, 2005, both of which are incorporated by reference.

BACKGROUND OF THE INVENTION

1. Field of the Invention

The present invention relates to a method for leading a power line in a field of a semiconductor device using a semiconductor element.

2. Description of the Related Art

A driver circuit such as a source driver or a gate driver constituting a display device includes a logic circuit (hereinafter referred to as a logic portion) which sequentially outputs pulses according to desired timing and performs arithmetic processing such as capture of data, such as a shift resister circuit or a latch circuit, and a circuit (hereinafter referred to as a buffer portion) which amplifies signal amplitude such as a buffer circuit or a level shifter circuit.

Such a driver circuit has been developed as a control portion in a display device having a liquid crystal element (hereinafter referred to as a liquid crystal display device) or a display device having a self-luminous element (hereinafter referred to as a light emitting device).

Conventionally, a power line supplying the same potential to a logic portion and a buffer portion is shared by the logic portion and the buffer portion, and the potential is applied to a necessary part in the logic portion and the buffer portion by the same wiring. In particular, a power line for supplying a ground potential is usually shared by a logic portion and a buffer portion. By sharing a wiring in this way, an area occupied by the wiring can be decreased, and a frame of a display device is narrowed.

As shown in FIG. 6, conventionally, a power line 601 supplying the same potential to a logic portion 105 and a buffer portion 108 is led from one FPC (flexible printed circuit) terminal 600 for power, so that the logic portion 105 and the buffer portion 108 share the power line 601 led from the FPC terminal 600 for power up to near the logic portion and the buffer portion. This is because leading of the power line is easy and a space for layout can be small when the power line is shared up to near the circuit portions.

However, when the FPC terminal 600 for power and the power line 601 led from the FPC terminal 600 for power are shared by the logic portion 105 and the buffer portion 108, there is a possibility that an instantaneous high-current consumed by the buffer portion 108 at the time of writing into a pixel causes a voltage drop of the power line 601, and noise is generated, which leads to malfunction of the logic portion 105 affected by the noise.

This results from the fact that the logic portion which is a circuit for outputting a pulse consumes less current compared to the buffer portion, and the buffer portion which amplifies signal amplitude consumes more current compared to the logic portion.

In a case of a source driver, the above-described problem is more serious, since a source driver operates faster than a gate driver and has a higher load than a gate driver. In a source driver, an instantaneous high-current is consumed at the time of data writing, and the larger a current value is, the larger a voltage drop of a power line becomes. Therefore, when a logic portion and a buffer portion of the source driver share the power line, there is a high possibility that the logic portion is affected by noise generated due to a voltage drop of the power line of the buffer portion, and that the logic portion malfunctions.

In addition, particularly in a case of line-sequential driving, the above-described problem is serious, since a source driver writes data for one line at a time in a case of the line-sequential driving. Therefore, when a logic portion and a buffer portion of a source driver performing line-sequential driving share the power line, there is a high possibility that the logic portion is largely affected by noise generated due to a voltage drop of the power line of the buffer portion, and that the logic portion malfunctions.

As is clear from Ohm's law, a voltage drop is expressed by V=IR. V [V] represents a voltage (a value of a voltage drop); I [A], a current; and R [Ω], resistance. In this case, R [Ω] is wiring resistance and the value thereof is the same in the logic portion and the buffer portion, but I [A] is different between the logic portion and the buffer portion. For example, a low potential side of a power line which is led from an FPC terminal for power and connected to each of the logic portion and the buffer portion is set to be the same, and different potentials are applied to the logic portion and the buffer portion for a high potential side. Generally, high output amplitude is necessary in a buffer portion, so that a potential to be applied to the buffer portion is set to be higher than the logic portion, and output load capacitance of the buffer portion is higher than the logic portion.

Therefore, a large voltage drop can occur in the power line in the buffer portion where an instantaneous high-current is consumed. At this time, in a case where the logic portion and the buffer portion share the power line supplying the same potential, there is a possibility that the logic portion is affected by noise generated due to a large voltage drop of the power line of the buffer portion, and accurate data is not captured when capturing data; thus causing a problem such as a display defect.

SUMMARY OF THE INVENTION

In view of the foregoing, it is an object of the present invention to solve a problem that a logic portion is affected by noise generated due to a large voltage drop of a power line of a buffer portion, and that the logic portion malfunctions.

In view of the above-described problem, one feature of the present invention is that separate power lines are used for a logic potion and a buffer portion although it is possible to share one power line between the logic portion and the buffer portion, so that malfunction of the logic circuit affected by noise does not occur. By using separate power lines for the logic portion and the buffer portion instead of sharing one power line, the logic portion can be prevented from being affected by noise caused by high power consumption in the buffer circuit.

For example, in the present invention, a wiring for supplying a ground potential which is the same potential for a logic portion and a buffer portion is not shared by the logic portion and the buffer portion, and separate connecting terminals for an external signal (hereinafter referred to as FPC terminals) are used for the logic portion and the buffer portion. By using separate FPC terminals for the logic portion and the buffer portion, instead of using one power line shared by the logic portion and the buffer portion, the logic portion can be prevented from being affected by noise caused by high power consumption in the buffer circuit.

Alternatively, in the present invention, a power line supplying a ground potential which is the same potential for a logic portion and a buffer portion is branched at a point far from a circuit to be supplied with the ground potential, specifically, at a point far from the logic portion and the buffer portion, that is, at a point close to an FPC terminal. By branching a power line at a point close to the FPC terminal, the logic portion can be prevented from being affected by noise caused by high power consumption in the buffer circuit.

One mode of the present invention is a semiconductor device including: an external circuit; a driver circuit including a buffer portion and a logic portion, which is formed over a substrate having an insulating surface; and over the substrate, a first connecting terminal and a second connecting terminal, for inputting a signal from the external circuit, which are provided on one side of the substrate. In the semiconductor device, a first power line extended from the first connecting terminal is electrically connected to the buffer portion; a second power line extended from the second connecting terminal is electrically connected to the logic portion; and the first connecting terminal and the second connecting terminal have the same potential.

Another mode of the present invention is a semiconductor device including: an external circuit; a driver circuit including a buffer portion and a logic portion, which is formed over a substrate having an insulating surface; and over the substrate, a first connecting terminal and a second connecting terminal, for inputting a signal from the external circuit, which are provided on one side of the substrate. In the semiconductor device, a first power line extended from the first connecting terminal is electrically connected to the buffer portion; a second power line extended from the second connecting terminal is electrically connected to the logic portion; the first connecting terminal and the second connecting terminal have the same potential; and a width of the first power line is wider than a width of the second power line.

Another mode of the present invention is a semiconductor device including: an external circuit; a driver circuit including a buffer portion and a logic portion, which is formed over a substrate having an insulating surface; and over the substrate, a connecting terminal for inputting a signal from the external circuit, which is provided on one side of the substrate. In the semiconductor device, a power line extended from the connecting terminal to the logic portion is branched at a point of $3/5$ or less of a length of the power line from the connecting terminal so that one of the branched power lines is electrically connected to the buffer portion and the other is electrically connected to the logic portion.

Another mode of the present invention is a semiconductor device including: an external circuit; a driver circuit including a buffer portion and a logic portion, which is formed over a substrate having an insulating surface; and over the substrate, a connecting terminal for inputting a signal from the external circuit, which is provided on one side of the substrate. In the semiconductor device, a power line extended from the connecting terminal to the logic portion is branched at a point of $3/5$ or less of a length of the power line from the connecting terminal so that one of the branched power lines is electrically connected to the buffer portion and the other is electrically connected to the logic portion; and a width of the one of the branched power lines is wider than a width of the other power line.

In the present invention, "the same potential" can be a ground potential.

In the present invention, the driver circuit is provided in a source driver.

In the present invention, the logic portion includes a latch circuit and a shift resister circuit.

In the present invention, the driver circuit includes a latch circuit for performing line-sequential driving.

In the present invention, the buffer portion includes a level shifter circuit and a buffer circuit.

A semiconductor device of the present invention is a display device including a self-luminous element, or a display device including a liquid crystal element.

According to the present invention, a problem that a logic portion is affected by noise generated by a voltage drop of a power line due to high-current consumption in a buffer portion and that the logic portion malfunctions can be solved.

BRIEF DESCRIPTION OF THE DRAWINGS

FIG. 4 is a view showing an FPC terminal portion of the present invention.

FIG. 5 is a view showing a source driver portion of the present invention.

FIGS. 7A and 7B are views each showing a light emitting device of the present invention.

DETAILED DESCRIPTION OF THE INVENTION

Figure 1:
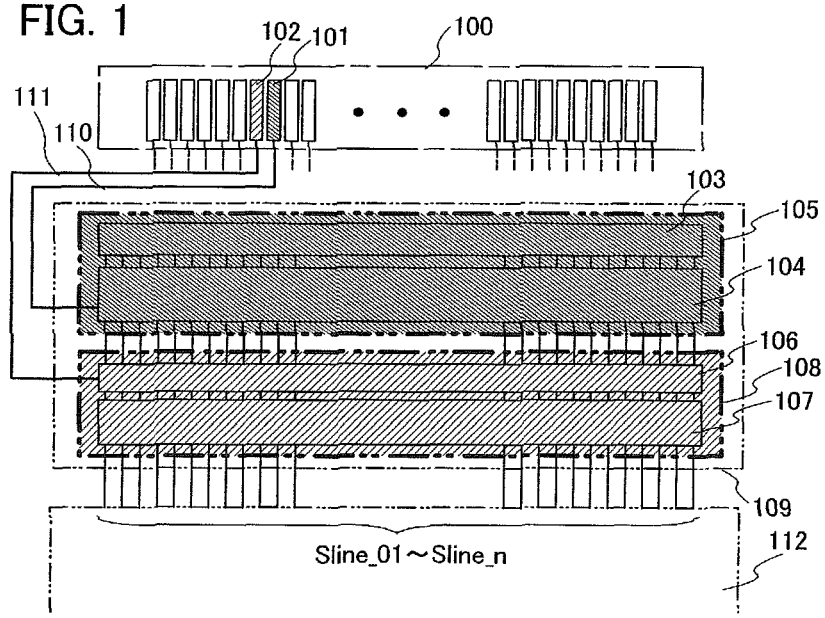
FIG. 1 is a view showing a driver portion provided with a plurality of power lines each connected to an FPC terminal.

Embodiment modes of the present invention will be described hereinafter with reference to the drawings. However, the present invention can be carried out in various modes, and it is easily understood by those skilled in the art that the modes and details can be changed in various ways without departing from the spirit and scope of the present invention. Therefore, the present invention is not interpreted as being limited to the following description of the embodiment modes. In all the drawings for describing the embodiment modes, the same reference numerals and symbols are used for denoting the same portions or portions having the same functions, and repeated descriptions thereof will be omitted.

(Embodiment Mode 1)

In the present embodiment mode, an example method for leading a power line extended from an FPC terminal will be described.

In FIG. 1, a semiconductor device including a source driver provided with a portion performing line-sequential driving is shown. FIG. 1 is a view showing a way of leading a power line in the vicinity of an FPC terminal portion provided on one side of a substrate and a source driver circuit, as a method for leading a power line of the present invention. Hereinafter, a structure of the FPC terminal portion and the inside of the source diver will be described.

The semiconductor device includes an FPC terminal portion 100, a source driver 109, and a pixel portion 112, provided over an insulating surface. The FPC terminal portion includes a plurality of FPC terminals. The number of FPC terminals may be set according to need. However, when the number of FPC terminals is large, there is a possibility that poor connection occurs at the time of connection with an external circuit, so that the number is preferably small. The source driver 109 includes a shift resister circuit 103, a latch circuit 104, a level shifter circuit 106, and a buffer circuit 107. In the source driver, data for one line is written at a time into the latch circuit 104, and line-sequential driving is performed. A low current consumption portion in which a pulse is sequentially outputted according to desired timing and capture of data or the like is performed, such as the shift resister circuit 103 and the latch circuit 104, is a logic portion 105, and a high current consumption portion in which signal amplitude is amplified and an instantaneous high-current is consumed, such as the buffer circuit 107 and the level shifter circuit 106, is a buffer portion 108. In addition, an output of the buffer circuit 107 is Sline, and expressed by Sline_01 to Sline_n (n is a natural number). The Sline_01 to Sline_n are electrically connected to a signal line included in the pixel portion 112, and a predetermined video signal is inputted thereto.

The logic portion and the buffer portion are respectively connected to separate power lines (that is, wirings) which are respectively led from separated FPC terminals. As a result, a problem that the logic portion is affected by noise generated by a voltage drop of the power line caused by high-current consumption in the buffer portion and that the logic portion malfunctions, can be solved.

Specifically, the FPC terminal portion 100 includes a first FPC terminal 101 and a second FPC terminal 102, and the semiconductor device further includes a first power line 110 extended from the first FPC terminal 101 and a second power line 111 extended from the second FPC terminal 102. Potential of the first power line 110 and the second power line 111 are set to be the same potential, which potential may be potential of a high potential side or a low potential side. For example, the potential of the first power line 110 and the second power line 111 can be 4.5 to 5.5 V in a case of a high potential side, and can be 0 V in a case of a low potential side. It is to be noted that the potential differs depending on a power line used for the semiconductor device. For example, the potential of the first power line 110 and the second power line 111 can be a ground potential.

In particular, a wiring supplying a fixed potential such as a ground potential is conventionally shared by many circuits in order to reduce a wiring region. However, a feature of the present invention is that separate wirings or separate FPC terminals for supplying a common potential are used. That is, as shown in FIG. 1, as FPC terminals for power, supplying the same potential to the logic portion and the buffer portion, the separate first FPC terminal 101 and second FPC terminal 102 are used. And the first power line 110 and the second power line 111 are led from the first FPC terminal 101 and the second FPC terminal 102 toward the logic portion 105 and the buffer portion 108, respectively. Since the first FPC terminal 101 and the second FPC terminal 102 have the same potential, the first power line 110 and the second power line 111 also have the same potential.

In such a display device of line-sequential driving, since writing into pixels for one line in a pixel portion 112 is performed at once in the buffer portion 108, transistors (typically, thin film transistors: TFTs) included in the buffer portion 108 are driven all at once. Then, an instantaneous high-current is consumed in the buffer portion 108. Due to this instantaneous high-current consumption, a potential of the first power line 110 instantaneously becomes low in a case where it is a power line of a high potential side, or a potential of the first power line 110 instantaneously becomes high in a case where it is a power line of a low potential side. Accordingly, a phenomenon of a voltage drop occurs. In the present invention, however, the separate first FPC terminal 101 and second FPC terminal 102 are used, and the first power line 110 connected to the logic portion 105 and the second power line 111 connected to the buffer portion 108 are provided separately. Therefore, it becomes possible to reduce the problem that the logic portion 105 is affected by noise generated by a voltage drop of the first power line 110.

As described above, by using separate FPC terminals for power, supplying the same potential to the logic portion and the buffer portion, instead of sharing a power line and an FPC terminal for power as in a conventional case, it becomes possible to reduce the problem that the logic portion 105 is affected by noise and malfunctions, even when a voltage of the first power line drops and noise is generated, since the logic portion and the buffer portion do not share the power line.

In the present embodiment mode, the explanation is made setting a low current consumption portion in which a pulse is sequentially outputted according to desired timing and capture of data or the like is performed, such as the shift resister circuit and the latch circuit, to be a logic portion, and setting a high current consumption portion in which signal amplitude is amplified and an instantaneous high-current is consumed, such as the buffer circuit and the level shifter circuit, to be a buffer circuit. However, the gist of the explanation of the present invention is that separate power lines are used in a case of supplying power lines having the same potential to a circuit with large current consumption and a circuit with small current consumption. Therefore, a scope where the present invention can be applied is not limited to the logic portion and the buffer portion. For example, the present invention can be applied to a shift resister circuit and a latch circuit in a logic portion.

(Embodiment Mode 2)

In the present embodiment mode, a mode will be described, in which an FPC terminal for power is shared by a logic portion and a buffer portion, and a power line is branched at a point which is as far from a circuit to be driven as possible, preferably at a point close to the FPC terminal, so that a problem that noise is generated due to a voltage drop of the power line and that a logic portion malfunctions by being affected by the noise is reduced.

Figure 2:
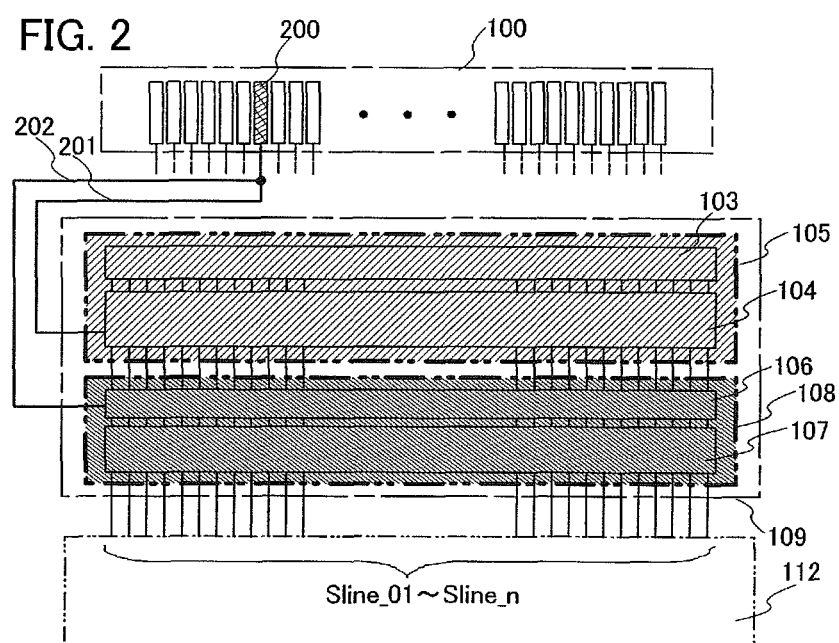
FIG. 2 is a view showing a driver portion provided with a plurality of power lines connected to one FPC terminal.

FIG. 2 shows an example of the present embodiment mode. In the present embodiment mode, an explanation will be made taking a source driver capable of line-sequential driving as an example, in the same way as FIG. 1. FIG. 2 is a view showing a way of leading a power line in the vicinity of an FPC terminal portion and a source driver circuit, as a method for leading a power line of the present invention. Hereinafter, a structure of the FPC terminal portion and the inside of the source diver will be described.

In the same way as the above-described embodiment mode, a semiconductor device includes an FPC terminal portion 100, a source driver 109, and a pixel portion 112, provided over an insulating surface. A difference from the above-described embodiment mode is that a power line led from an FPC terminal 200 and branched into two wirings, one of which is a first power line 201, and the other of which is a second power line 202, at a point close to the FPC terminal 200, is provided. The branching point may be provided at a point of ⅗ or less of a length of the power line from the FPC terminal, and preferably, at a point of ⅓ or less of a length of the power line from the FPC terminal. For example, in a case where a length of the power line from the FPC terminal to the buffer portion is 12000 μm, the branching point may be provided at a point 2300 μm from the FPC terminal. In this way, the longer a distance between the buffer portion which generates noise and the branching point of the power line is, the better the problem can be prevented, in which the logic portion is affected by noise and malfunctions. This is because the longer a distance from the buffer portion is, the smaller the noise generated by a voltage drop on the power line from the buffer portion to the FPC terminal is.

Potential of the first power line 201 and the second power line 202 may be potential of a high potential side or a low potential side. For example, the potential of the first power line 201 and the second power line 202 can be 4.5 to 5.5 V in a case of a high potential side, and can be 0 V in a case of a low potential side. It is to be noted that the potential differs depending on a power line used for a semiconductor device. It is to be noted that the first power line 201 and the second power line 202 share the FPC terminal 200, so that the same potential is applied to each of them. For example, the potential of the first power line 201 and the second power line 202 can be a ground potential.

As shown in FIG. 2, the first power line 201 and the second power line 202, which are connected to the FPC terminal 200 having the same potential and branched at a point close to the FPC terminal, are connected to the logic portion 105 and the buffer portion 108, respectively. Since the first power line 201 and the second power line 202 share the FPC portion 200, they have the same potential. In addition, in a case where the FPC terminal for the power line with the same potential is shared and the power line is branched, it is preferable that the power line be branched at a point far from a circuit to be driven, that is, at a point close to the FPC terminal 200. This is because an effect of noise caused by a voltage drop cannot be prevented if the power line with the same potential is branched at a point close to circuits such as the logic portion 105 and the buffer portion 108.

In such a display device, when the buffer portion 108 performs writing into a pixel and TFTs are driven all at once, the buffer portion 108 consumes an instantaneous high-current. Due to this instantaneous high-current consumption, a potential of the first power line 201 instantaneously becomes low in a case where it is a power line of a high potential side, or a potential of the first power line 201 instantaneously becomes high in a case where it is a power line of a low potential side. Accordingly, a phenomenon of a voltage drop occurs. In the present invention, however, the power line is branched at a point close to the FPC terminal 200 into the first power line 201 connected to the logic portion 105 and the second power line 202 connected to the buffer portion 108. Therefore, it becomes possible to reduce the problem that the logic portion 105 is affected by noise generated by a voltage drop of the first power line 201.

As described above, by branching a power line at a point close to an FPC terminal while the FPC terminal for power is shared, although the power line with the same potential is conventionally shared, it becomes possible to reduce the problem that the logic portion is affected by noise and malfunctions, even when a voltage of the first power line 201 drops and noise is generated.

Since an FPC terminal for power for a power line with the same potential can be shared in the present embodiment, effects of the present invention can be obtained without increasing the number of FPC terminals.
(Embodiment Mode 3)

In the present embodiment mode, an appearance of one mode of a light emitting device of the present invention will be described with reference to FIGS. 7A and 7B. FIG. 7A is a top view of a panel which is formed by sealing a TFT and a light emitting element formed over a first substrate between the first substrate and a second substrate, using a sealant. FIG. 7B corresponds to a cross-sectional view along a line A-A' in FIG. 7A.

Over a first substrate 4001, a pixel portion 4002, a source driver 4003 including a logic portion 4023 and a buffer portion 4013, and a gate driver 4004 are provided, and a sealant 4005 is also provided so as to surround the pixel portion. In addition, a second substrate 4006 is provided over the pixel potion 4002 with the sealant 4005 interposed therebetween. In the display device shown in FIGS. 7A and 7B, the pixel portion 4002, the source driver 4003, and the gate driver 4004 are sealed with a filler 4007 by the first substrate 4001, the sealant 4005, and the second substrate 4006.

The pixel portion 4002, the source driver 4003, and the gate driver 4004 formed over the first substrate 4001 have a plurality of TFTs, and a TFT 4008 included in the source driver 4003 and a TFT 4009 included in the pixel portion 4002 are shown as examples in FIG. 7B.

Reference numeral 4011 corresponds to the light emitting element, and part of a wiring 4017 connected to a drain of the TFT 4009 functions as a first electrode of the light emitting element 4011. A transparent conductive film 4012 functions as a second electrode of the light emitting element 4011. It is to be noted that a structure of the light emitting element 4011 is not limited to the structure shown in the present embodiment mode. As the above-described embodiment modes, the structure of the light emitting element 4011 can be arbitrarily changed according to a direction of light emitted from the light emitting element 4011, polarity of the TFT 4009, or the like. The direction of light emitted from the light emitting element 4011 can be the first substrate 4001 side, the second substrate 4006 side, or both the first substrate 4001 side and the second substrate 4006 side.

Although not shown in the cross-sectional view of FIG. 7B, various signals and voltage are supplied to the source driver 4003, the gate driver 4004, or the pixel portion 4002, from an FPC terminal 4016 via power lines 4014 and 4015.

In the present embodiment, the FPC terminal 4016 is formed of the same conductive film as the first electrode of the light emitting element 4011. Furthermore, the power line 4014 is formed of the same conductive film as a wiring 4017. In addition, the power line 4015 is formed of the same conductive film as a gate included in each of the TFT 4009 and the TFT 4008.

The FPC terminal 4016 is electrically connected to a terminal included in an FPC 4018 via an anisotropic conductive film 4019. As seen from the cross-sectional view in FIG. 7B, in a power line separating portion 4020, a voltage is supplied from the FPC terminal 4016 via the power lines 4014 and 4015, and the power line can be separated or branched into the desired number of power lines to be led to desired portions.

The first substrate 4001 and the second substrate 4006 are substrates having insulating surfaces, and specifically, glass, a metal (stainless-steel, typically), ceramics, plastic or the like can be used. As plastic, an FRP (fiberglass-reinforced plastics) sheet, a PVF (polyvinyl fluoride) film, a mylar film, a polyester film, or an acrylic resin film can be used. In addition, a sheet in which an aluminum foil is sandwiched by the PVF film or the mylar film can also be used.

However, the substrate which is located on a side where light from the light emitting element 4011 is emitted needs to have a light-transmitting property. For example, in a case where light is emitted through the second substrate 4006 side, the second substrate 4006 needs to have a light-transmitting property. In that case, a material with a light-transmitting property, such as a glass plate, a plastic sheet, a polyester film, or an acrylic film is used.

As the filler 4007, an ultraviolet curable resin or a thermoset resin can be used, in addition to an inert gas such as nitrogen or argon. Specifically, PVC (polyvinyl chloride), acrylic, polyimide, an epoxy resin, a silicon resin, PVB (polyvinyl butyral), EVA (ethylene vinyl acetate) or the like can be used. In the present embodiment mode, nitrogen is used as the filler.

In this way, the light emitting device can be manufactured. As described above, separate FPC terminals for power are used, instead of sharing an FPC terminal for a power line with the same potential between a logic portion and a buffer portion as in a conventional case, or the power line is branched at a point close to the FPC terminal, instead of sharing the power line with the same potential between a logic portion and a buffer portion as in a conventional case. By doing so, it becomes possible to reduce the problem that the logic portion included in the light emitting device is affected by noise and malfunctions, even when a voltage of the power line drops and noise is generated.

The present embodiment mode can be freely combined with the above-described embodiment modes.

(Embodiment Mode 4)

Figure 3A:
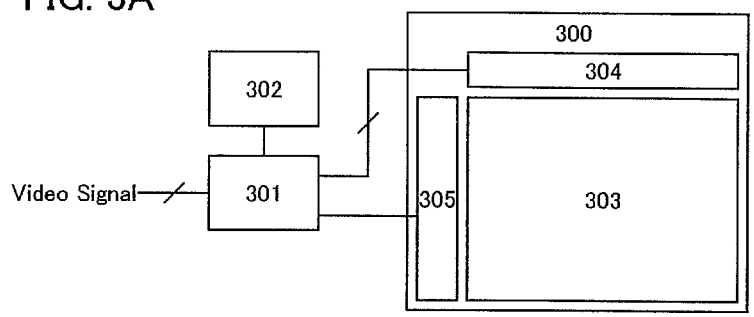
FIGS. 3A and 3B are block diagrams each showing a light emitting device of the present invention.

In the present embodiment mode, a structure of a light emitting device is shown in a block diagram of FIG. 3A as an example.

The light emitting device shown in FIG. 3A includes a panel 300, a controller 301, and a table 302 over an insulating surface. In addition, the panel 300 includes a pixel portion 303 with pixels each of which has a light emitting element, a source driver 304, and a gate driver 305.

Figure 3B:
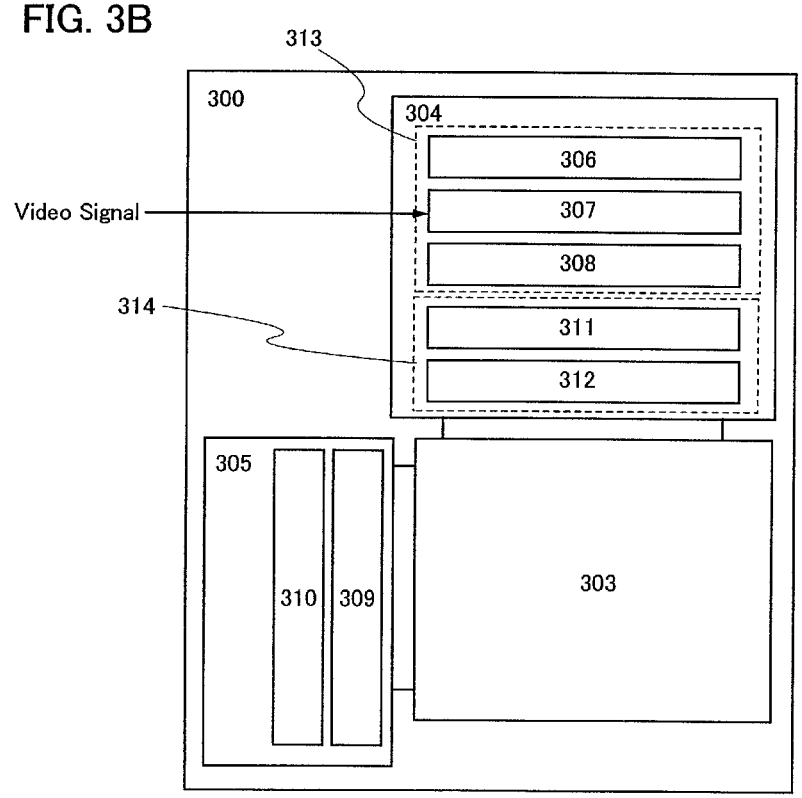
Figure 6:
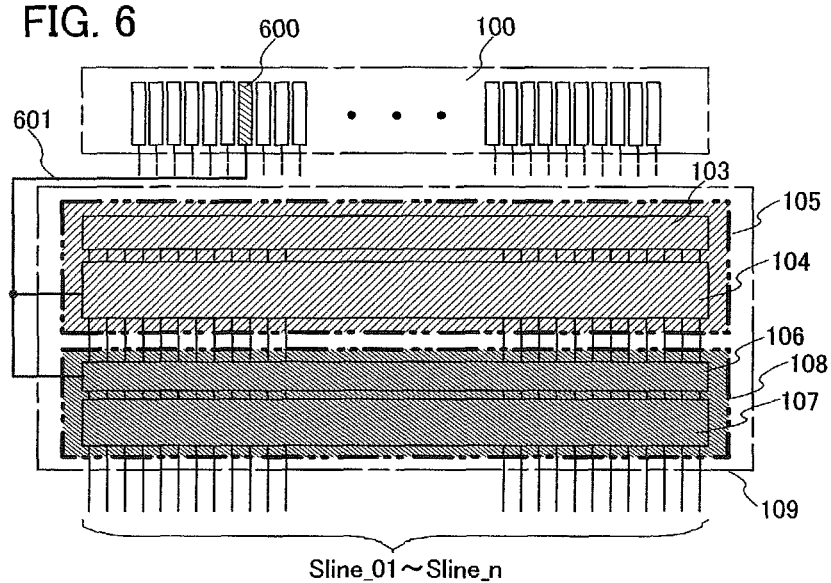
FIG. 6 is a view showing a driver portion provided with a conventional power line.

FIG. 3B is an example of a more specific structure of the panel 300 shown in FIG. 3A. In FIG. 3B, the source driver 304 includes a logic portion 313 having a shift resister circuit 306, a first latch circuit 307, and a second latch circuit 308; and a buffer portion 314 having a level shifter circuit 311 and a buffer circuit 312. It is to be noted that a circuit which can select a signal line, such as a decoder, may be used instead of the shift resister circuit 306.

The gate driver 305 includes a shift resister circuit 309 and a buffer circuit 310. The gate driver 305 may further include a level shifter. It is to be noted that a circuit which can select a signal line, such as a decoder, may be used instead of the shift resister circuit 309.

In such a light emitting device, separate FPC terminals for power are used, instead of sharing an FPC terminal for a power line with the same potential between a logic portion and a buffer portion as in a conventional case, or the power line is branched at a point close to the FPC terminal, instead of sharing a power line with the same potential between a logic portion and a buffer portion as in a conventional case. By doing so, it becomes possible to reduce the problem that the logic portion included in the light emitting device is affected by noise and malfunctions, even when a voltage of the power line drops and noise is generated. Furthermore, the present invention can be applied to a shift resister circuit and a latch circuit in a logic portion. As a result, noise of a signal for display is reduced and a light emitting device with less flickering can be provided.

(Embodiment Mode 5)

In the present embodiment mode, a circuit structure of the above-described light emitting device will be described.

Figure 9:
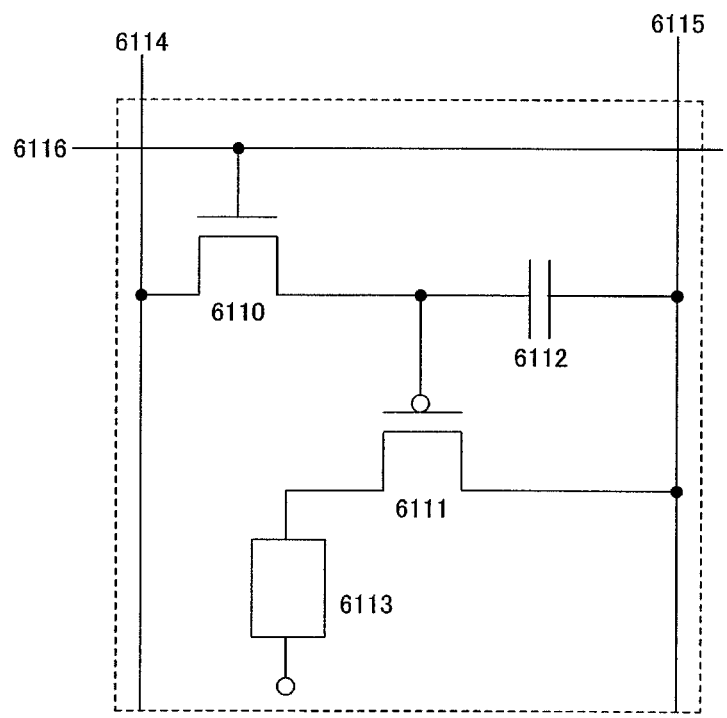
FIG. 9 is a diagram showing a pixel circuit of the present invention.

FIG. 9 shows an example of an equivalent circuit diagram of a pixel, and a signal line 6114, a power line 6115, a scanning line 6116, a light emitting element 6113, transistors 6110 and 6111, and a capacitative element 6112 are included. A video signal is inputted to the signal line 6114 by a source driver. The transistor 6110 can control supply of a potential of the video signal to a gate of the transistor 6111 in accordance with a selection signal inputted to the scanning line 6116. The transistor 6111 can control supply of a current to the light emitting element 6113 in accordance with the potential of the video signal. The capacitative element 6112 can maintain a voltage between a gate and a source of the transistor 6111. It is to be noted that, although the capacitative element 6112 is shown in FIG. 9, the capacitative element 6112 is not necessarily provided in a case where its function can be covered by gate capacitance of the transistor 6111 or other parasitic capacitance.

Figure 10A:
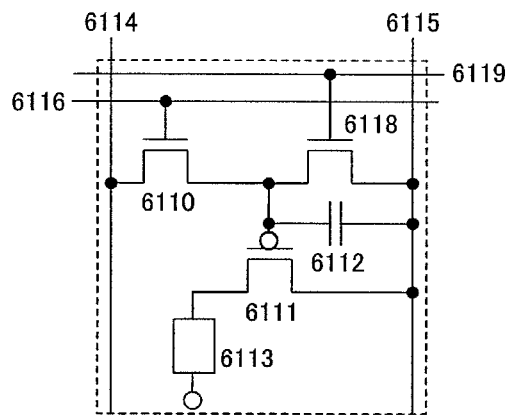
FIGS. 10A and 10B are diagrams each showing a pixel circuit of the present invention.

FIG. 10A is an equivalent circuit diagram of a pixel in which a transistor 6118 and a scanning line 6119 are newly added to the pixel shown in FIG. 9. Since a condition where no current flows in the light emitting element 6113 can forcibly be made by the transistor 6118 by making the gate and the source of the transistor 6111 have the same potential, a length of a sub-frame period can be shorter than a period in which a video signal is inputted to all the pixels. This is preferable when display of high gradation number is performed while suppressing the drive frequency.

Figure 10B:
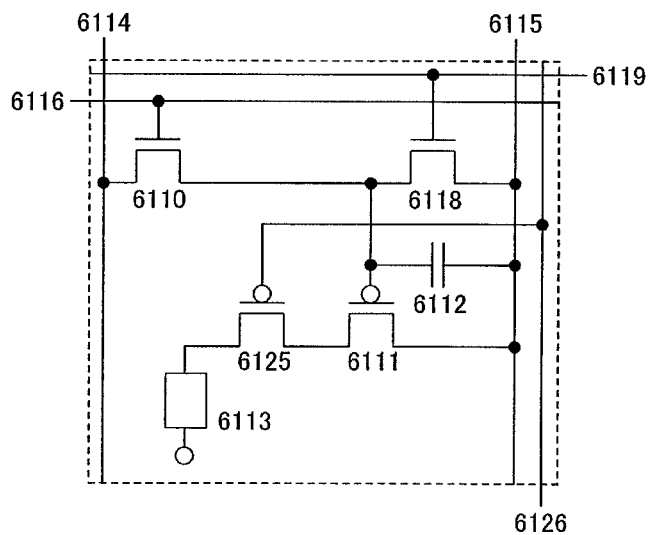

FIG. 10B is an equivalent circuit diagram of a pixel in which a transistor 6125 and a wiring 6126 are newly added to the pixel shown in FIG. 10A. A potential of a gate of the transistor 6125 is fixed by the wiring 6126. The transistor 6111 and the transistor 6125 are connected in series between the power line 6115 and the light emitting element 6113. Accordingly, in FIG. 10B, a value of a current to be supplied to the light emitting element 6113 is controlled by the transistor 6125, and whether or not the current is supplied to the light emitting element 6113 can be controlled by the transistor 6111.

In such a light emitting device, separate FPC terminals for power are used, instead of sharing an FPC terminal for a power line with the same potential between a logic portion and a buffer portion as in a conventional case, or the power line is branched at a point close to the FPC terminal, instead of sharing a power line with the same potential between a logic portion and a buffer portion as in a conventional case. By doing so, it becomes possible to reduce the problem that the logic portion included in the light emitting device is affected by noise and malfunctions, even when a voltage of the power line drops and noise is generated. Furthermore, the present invention can be applied to a shift resister circuit and a latch circuit in a logic portion. As a result, noise of a power line is reduced and a light emitting device with less flickering can be provided.

It is to be noted that a pixel circuit included in a display device of the present invention is not limited to the structure shown in the present embodiment mode. In addition, the present embodiment mode can be freely combined with the above-described embodiment modes.

(Embodiment Mode 6)

Figures 11A, 11B:
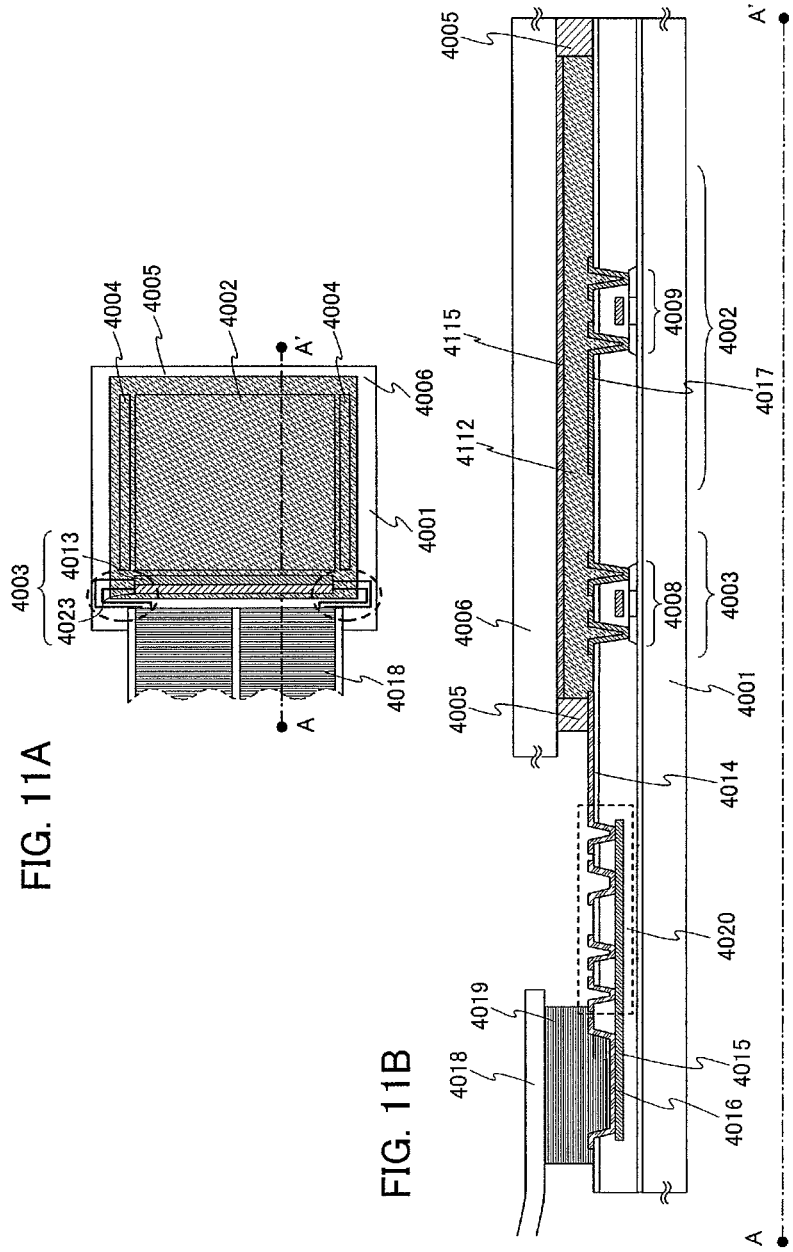
FIGS. 11A and 11B are views each showing a light emitting device of the present invention.

In the present embodiment mode, an appearance of a mode of a liquid crystal display device which is different from the above-described embodiment mode will be described with reference to FIGS. 11A and 11B. FIG. 11A is a top view of a panel which is formed by sealing a TFT and a liquid crystal element formed over a first substrate between the first substrate and a second substrate, using a sealant in the same way as the above-described embodiment mode. FIG. 11B corresponds to a cross-sectional view along a line A-A' in FIG. 11A.

In the liquid crystal display device, the liquid crystal element 4112 is sandwiched between a first substrate 4001 and a second substrate 4006. The liquid crystal element 4112 controls transmission of light from a backlight by a change in an orientation condition made by a TFT 4009 in a pixel portion 4002 and an opposite electrode 4115 provided on the second substrate 4006 side, so that display can be performed. In order to align the orientation of the liquid crystal element 4112, an orientation film may be preferably provided for a surface to be connected to the liquid crystal element 4112, that is, over the TFT 4009 and TFT 4008, and over the second substrate 4006. In addition, a color filter may be provided for the first substrate 4001 or the second substrate 4006, for full-color display.

In the same way as the above-described embodiment mode, an FPC terminal 4016 is electrically connected to a terminal included in an FPC 4018 via an anisotropic conductive film 4019. In addition, as seen from the cross-sectional view in FIG. 11B, in a power line separating portion 4020, a voltage is supplied from the FPC terminal 4016 via the power lines 4014 and 4015 and the power line can be separated or branched into the desired number of power lines to be led to desired portions.

The structure other than this is similar to the above-described embodiment mode, so that the explanation is omitted here.

In this way, the liquid crystal display device can be manufactured. As described above, separate FPC terminals for power are used, instead of sharing an FPC terminal for a power line with the same potential between a logic portion and a buffer portion as in a conventional case, or the power line is branched at a point close to the FPC terminal, instead of sharing a power line with the same potential between a logic portion and a buffer portion as in a conventional case. By doing so, it becomes possible to reduce the problem that the logic portion included in the liquid crystal display device is affected by noise and malfunctions, even when a voltage of the power line drops and noise is generated.

The present embodiment mode can be freely combined with the above-described embodiment modes.

(Embodiment Mode 7)

As described in the embodiment modes above, in the present invention, in a case where the same potential is supplied to a logic portion and a buffer portion, separate FPC terminals are used for the logic portion and the buffer portion, or the FPC terminal is shared but a power line is branched for the logic portion and the buffer portion at a point close to the FPC terminal, so that a problem such as a display defect caused by malfunction of a circuit in the logic portion being affected by noise can be reduced, even when noise is generated by a voltage drop of the power line due to instantaneous high-current consumption in the buffer portion. Therefore, the present invention can be preferably used for a display portion of a battery-powered electronic device, a display device with a large-sized screen, a display portion of an electronic device, or the like. The following can be given as examples: a television device (a TV or a television receiver), a camera such as a digital camera or a digital video camera, a cellular phone device (a cellular phone handset), a portable information terminal such as PDA, a portable game machine, a monitor, a computer, an audio reproducing device such as a car audio, an image reproducing device provided with a recording medium such as a home game machine, and the like. Specific examples thereof will be described with reference to FIGS. 8A to 8F.

Figure 8A:
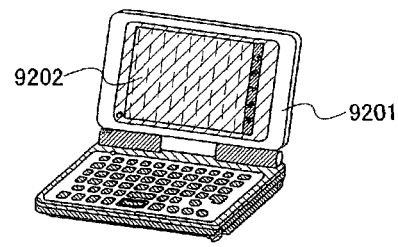
FIGS. 8A to 8F are views each showing an example in which the present invention is applied to an electronic device.

A portable information terminal device shown in FIG. 8A includes a main body 9201, a display portion 9202, and the like. A display device of the present invention can be applied to the display portion 9202. As a result, a portable information terminal device in which a problem such as a display defect caused by malfunction of a circuit being affected by noise is reduced can be provided.

Figure 8B:
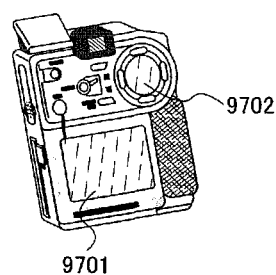

A digital video camera shown in FIG. 8B includes a display portion 9701, a display portion 9702, and the like. A display device of the present invention can be applied to the display portion 9701. As a result, a digital video camera in which a problem such as a display defect caused by malfunction of a circuit being affected by noise is reduced can be provided.

Figure 8C:
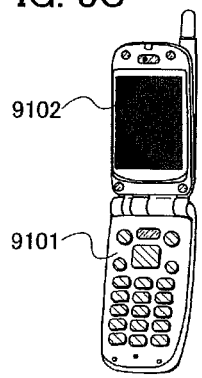

A cellular phone handset shown in FIG. 8C includes a main body 9101, a display portion 9102, and the like. A display device of the present invention can be applied to the display portion 9102. As a result, a cellular phone handset in which a problem such as a display defect caused by malfunction of a circuit being affected by noise is reduced can be provided.

Figure 8D:
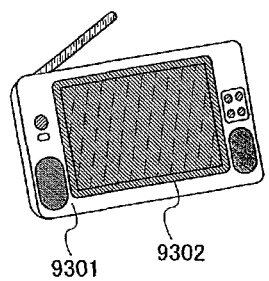

A portable television device shown in FIG. 8D includes a main body 9301, a display portion 9302, and the like. A display device of the present invention can be applied to the display portion 9302. As a result, a portable television device in which a problem such as a display defect caused by malfunction of a circuit being affected by noise is reduced can be provided. In addition, the display device of the present invention can be widely applied to various television devices such as a small-sized one incorporated in a portable terminal such as a cellular phone handset, a medium-sized one which is portable, and a large-sized one (for example, 40 inches or more in size).

Figure 8E:
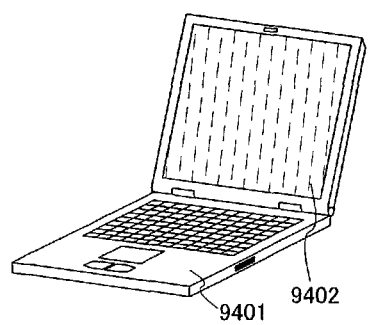

A laptop computer shown in FIG. 8E includes a main body 9401, a display portion 9402, and the like. A display device of the present invention can be applied to the display portion 9402. As a result, a laptop computer in which a problem such as a display defect caused by malfunction of a circuit being affected by noise is reduced can be provided.

Figure 8F:
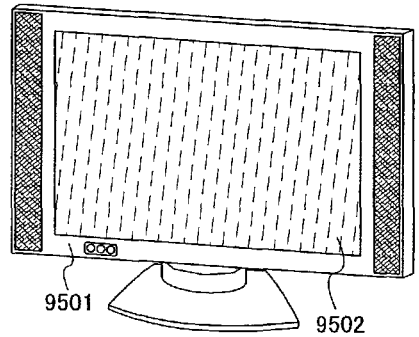

A television device shown in FIG. 8F includes a main body 9501, a display portion 9502, and the like. A display device of the present invention can be applied to the display portion 9502. As a result, a television device in which a problem such as a display defect caused by malfunction of a circuit being affected by noise is reduced can be provided.

In this way, by applying a display device of the present invention, electronic devices in which a problem such as a display defect caused by malfunction of a circuit being affected by noise is reduced can be provided.

[Embodiment]

In the present embodiment, an embodiment of the present invention in a case where an example specification of the above-described light emitting device is set to be as follows: a display size, 2.0 inches; a pixel configuration, QVGA; the number of pixels, 240×RGB×320; and a potential of a power line, a low potential, that is, GND (0 V); will be described.

FIG. 4 is a simplified schematic showing an FPC terminal portion for a ground (hereinafter referred to as GND) potential. Although a power line or a signal line is led from other FPC terminals than the FPC terminal for GND practically, a wiring led from the other FPC terminals than the FPC terminal for GND is not shown here in order to describe separation of a power line for GND (hereinafter referred to as a GND line) led from the FPC terminal for GND. Hereinafter, the FPC terminal portion for GND will be described.

An FPC terminal portion 400 includes an FPC terminal 401 for GND, another FPC terminal for power, and another FPC terminal for a signal. For branching a first GND line 402 led from the FPC terminal 401 for GND at a point close to the FPC terminal 401 for GND, the first GND line 402 is connected to a second GND line 404 through a contact 403, and the second GND line 404 is connected to a fourth GND line 408 for a buffer portion in a source driver through a contact 410 and to a fifth GND line 409 for a logic portion in the source driver through a contact 411; thereby branching the GND line in each contact. That is, by connecting the second GND line 404 to the fourth GND line 408 and the fifth GND line 409 through the contacts, branching of the GND line can be performed. A point where the GND line is branched can be set according to a layout space or condition, but it needs to be far from a circuit to be driven, that is, close to the FPC terminal 401 for GND. Specifically, branching is performed at a point of ⅓ to ⅗ of a length of the GND line extended from the FPC terminal to the circuit. In addition, the GND line is also branched into a sixth GND line 405, a seventh GND line 406, and a third GND line 407 for a gate driver, through a contact 412.

In the above-described way, one GND line is branched into five lines to be led to desired circuits in FIG. 4, but the number of branched GND lines is not limited to this. However, narrowing the GND line too much to supply a sufficient current has to be avoided. Branching of the GND line is performed in a scope which is possible in operation of the circuit and in layout.

A width d1 of the fourth GND line 408 is set to be wider than a width d2 of the fifth GND line 409 in FIG. 4. For example, the width of the fourth GND line 408 may be 2 to 5 times that of the fifth GND line 409, such as follows: the width of the fourth GND line 408, 120 μm; and the width of the fifth GND line 409, 40 μm.

A reason why there is a difference in width between the GND line connected to the logic portion and the GND line connected to the buffer portion will be described. In the logic portion in which a pulse is sequentially outputted according to a timing signal and capture of data is performed, charging and discharging of many nodes at a time is not often performed, so that instantaneous high-current consumption does not occur. On the other hand, in the buffer portion, such as a buffer portion performing line-sequential driving specifically, data processing for one line is performed at a time. That is, in the light emitting device shown in FIGS. 3A and 3B, buffer circuits for 240×RGB columns perform charging and discharging at a time. Therefore, in this moment, a high-current is consumed, in other words, a high-current flows. For this reason, the GND line for the buffer portion is led with a larger width than a width of the GND line for the logic portion.

Next, a way of leading the GND line in the vicinity of a logic portion 500 and a buffer portion 505 in a source driver will be described. In FIG. 5, several power lines and various signal lines are shown in addition to the fourth GND line 408 and the fifth GND line 409.

The fifth GND line 409 is used as a GND line 508 for a shift resister circuit 501 and a first latch circuit 503 in the logic portion 500, and a GND line 509 for a second latch circuit 504.

In addition, the fourth GND line 408 is used as a GND line for a level shifter circuit 506 and a buffer circuit 507 in the buffer portion 505.

As described above, separate or branched power lines can be used for the logic portion 500 as a low current consumption portion in which a pulse is sequentially outputted according to desired timing and capture of data or the like is performed, such as the shift resister circuit 501, the first latch circuit 503, and the second latch circuit 504; and the buffer portion 505 as a high current consumption portion in which signal amplitude is amplified and an instantaneous high-current is consumed, such as the buffer circuit 507 and the level shifter circuit 506. As a result, the conventional problem that a logic portion is affected by noise generated by a voltage drop of a GND line in a buffer portion and that the logic portion malfunctions, leading to a problem such as a display defect, can be reduced.

This application is based on Japanese Patent Application serial No. 2005-307856 filed in Japan Patent Office on Oct. 21st, in 2005, the contents of which are hereby incorporated by reference.

What is claimed is:

1. A semiconductor device comprising:
   a pixel portion including a light emitting element;
   a driver circuit including a buffer portion and a logic portion, which is provided over a substrate;
   a connecting terminal including a first conductive film over the substrate for supplying a voltage from an external circuit; and
   a power line electrically connected to the connecting terminal through a contact,
   wherein the power line is branched at a point of ⅗ or less of a length of the power line from the connecting terminal to the buffer portion,
   wherein a first line of the power line including a second conductive film is electrically connected to the buffer portion,
   wherein a second line of the power line including a third conductive film is electrically connected to the logic portion, and
   wherein the first conductive film, the second conductive film, and the third conductive film are formed in a same film as an electrode of the light emitting element.

2. The semiconductor device according to claim 1, wherein the voltage has a ground potential.

3. The semiconductor device according to claim 1, wherein the pixel portion is connected to the buffer portion.

4. The semiconductor device according to claim 1, wherein the driver circuit performs a line-sequential driving.

5. The semiconductor device according to claim 1, wherein the logic portion comprises at least one of a latch circuit and a shift register circuit.

6. The semiconductor device according to claim 1, wherein the buffer portion comprises at least one of a level shifter circuit and a buffer circuit.

7. The semiconductor device according to claim 1, wherein the power line is branched at a point of ⅓ or less of the length of the power line from the connecting terminal to the buffer portion.

8. The semiconductor device according to claim 1, wherein the substrate has an insulating surface.

9. The semiconductor device according to claim 1, wherein a width of the first line of the power line is wider than a width of the second line of the power line.

10. A semiconductor device comprising:
    a pixel portion including a light emitting element;
    a driver circuit including a first circuit and a second circuit, which is provided over a substrate;
    a connecting terminal including a first conductive film over the substrate for supplying a voltage from an external circuit; and
    a power line electrically connected to the connecting terminal through a contact, wherein the power line is branched at a point of ⅗ or less of a length of the power line from the connecting terminal to the first circuit, wherein a first line of the power line including a second conductive film is electrically connected to the first circuit, wherein a second line of the power line including a third conductive film is electrically connected to the second circuit, wherein the first circuit and the second circuit are connected electrically, and wherein the first conductive film, the second conductive film, and the third conductive film are formed in a same film as an electrode of the light emitting element.

11. The semiconductor device according to claim 10, wherein the voltage has a ground potential.

12. The semiconductor device according to claim 10, wherein the pixel portion is connected to the first circuit.

13. The semiconductor device according to claim 10, wherein the driver circuit performs a line-sequential driving.

14. The semiconductor device according to claim 10, wherein the second circuit comprises at least one of a latch circuit and a shift register circuit.

15. The semiconductor device according to claim 10, wherein the first circuit comprises at least one of a level shifter circuit and a buffer circuit.

16. The semiconductor device according to claim 10, wherein the power line is branched at a point of ⅓ or less of the length of the power line from the connecting terminal to the first circuit.

17. The semiconductor device according to claim 10, wherein the substrate has an insulating surface.

18. The semiconductor device according to claim 10, wherein a width of the first line of the power line is wider than a width of the second line of the power line.

* * * * *